(12) United States Patent
Suzuki et al.

(10) Patent No.: US 7,355,863 B2
(45) Date of Patent: Apr. 8, 2008

(54) HIGH FREQUENCY MULTILAYER INTEGRATED CIRCUIT

(75) Inventors: Ryota Suzuki, Sagamihara (JP); Taihei Nakada, Yokosuka (JP); Tsuyoshi Kumamoto, Yokohama (JP); Yuusuke Yamashita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 367 days.

(21) Appl. No.: 11/147,332

(22) Filed: Jun. 8, 2005

(65) Prior Publication Data

US 2005/0275078 A1    Dec. 15, 2005

(30) Foreign Application Priority Data

Jun. 11, 2004  (JP)  ............... 2004-173860

(51) Int. Cl.
*H05K 1/11*  (2006.01)
*H05K 1/14*  (2006.01)

(52) U.S. Cl. .................. 361/794; 361/792; 361/795; 174/260

(58) Field of Classification Search ........ 361/792–795; 174/259–264
See application file for complete search history.

(56) References Cited

U.S. PATENT DOCUMENTS

| 5,741,729 | A | * | 4/1998 | Selna ..................... 438/125 |
| 5,991,162 | A |   | 11/1999 | Saso |
| 6,388,890 | B1 | * | 5/2002 | Kwong et al. ............. 361/780 |
| 6,477,057 | B1 | * | 11/2002 | Buffet et al. ............. 361/780 |
| 6,700,076 | B2 | * | 3/2004 | Sun et al. ................ 174/262 |
| 6,900,992 | B2 | * | 5/2005 | Kelly et al. .............. 361/794 |
| 2002/0105083 | A1 |  | 8/2002 | Sun et al. |
| 2004/0034489 | A1 |  | 2/2004 | Ogino et al. |

FOREIGN PATENT DOCUMENTS

| FR | 2 340 021 A | 8/1977 |
| JP | 07-263871 A | 10/1995 |
| JP | 8-316686 A | 11/1996 |
| JP | 11-103176 | 4/1999 |
| JP | 2003-133471 A | 5/2003 |

\* cited by examiner

*Primary Examiner*—Tuan T. Dinh
(74) *Attorney, Agent, or Firm*—Oblon, Spivak, McClelland, Maier & Neustadt, P.C.

(57) ABSTRACT

A high frequency multilayer integrated circuit is provided with: a multilayer board including n earth conductor layers (n: integer of two or more than two) and (n-1) dielectric layers each arranged between adjacent earth conductor layers; a first high frequency circuit disposed in one of the most outside earth conductor layers of the multilayer board; a first power-supply/control circuit disposed in this most outside earth conductor layer; a second high frequency circuit disposed in at least one of the dielectric layers and connected to the first high frequency circuit in the multilayer board; a second power-supply/control circuit disposed in another one of the most outside earth conductor layers of the multilayer board; and a third power-supply/control circuit disposed in at least one of the dielectric layers at a portion at which the second high frequency circuit does not exist, the third power-supply/control circuit being connected to the first and second power-supply/control circuits.

5 Claims, 3 Drawing Sheets

HIGH FREQUENCY MULTILAYER INTEGRATED CIRCUIT

BACKGROUND OF THE INVENTION

1. Field of the Invention

The present invention relates to a high frequency multilayer integrated circuit in which a multilayer (or multi-layered) circuit board (herein, which is called multilayer board) is provided with a high frequency element and a power-supply/control element to thereby process high frequency signals.

2. Related Art

In a recent technology, according to positive usage of high frequency band area such as micro-wave band or milli-wave band, an integrated circuit (IC) technology or printed circuit board pattern formation technology have been put into practical use, and hence, an integrated circuit (IC) has been widely utilized for treating or processing high frequency signals of the micro-wave band or milli-wave band. As such integrated circuit, there is disclosed in, for example, Japanese Patent Laid-open (KOKAI) Publication No. HEI 5-299906, a high frequency multilayer integrated circuit having various circuit elements provided for a multilayer board.

FIG. 3 shows one example of a conventional high frequency multilayer integrated circuit such as disclosed in the above Japanese Patent Publication. With reference to FIG. 3, the high frequency multilayer integrated circuit 50 includes a first high frequency circuit 51 embedded in a first embedded dielectric or dielectric substance 52. Upper and lower earth electrodes 53 and 54 of the first high frequency circuit 51 are also disposed on both vertical sides of the first embedded dielectric 52, and an upper dielectric 55 is disposed on the upper earth electrode 53. Furthermore, a power-supply/control circuit connection via hole 56 is vertically arranged in a manner that a lower end thereof is connected to the first high frequency circuit 51 and an upper end thereof penetrates the upper earth electrode 53 and extends to the upper surface of the upper dielectric 55. Further, it is to be noted that the term "power-supply/control" used herein generally means "power-supply and/or control".

A power-supply/control circuit element 57 is arranged on the surface of the upper dielectric 55 and connected to a power-supply/control circuit line or wiring 58 disposed on the same surface of the upper dielectric 55. The first embedded dielectric 52 is formed with a cavity so that an intermediate portion of the high frequency circuit 51 is exposed, and in this cavity, a high frequency circuit element 59 is arranged so as to be connected to the high frequency circuit 51.

A second embedded dielectric 60 is disposed below the lower earth electrode 54, and a second high frequency circuit 61 is also embedded in the second embedded dielectric 60. Furthermore, a lowermost earth electrode 62 is disposed on the lower surface of the second embedded dielectric 60, and the first high frequency circuit 51 and the second high frequency circuit 61 are connected to each other through a layer-connection via hole 63.

Further, it is to be noted that, in the description concerning the above conventional high frequency multilayer integrated circuit 50, the term such as "upper", "lower" and the like are used in the state illustrated in FIG. 3.

In the high frequency multilayer integrated circuit of the structure mentioned above, the high frequency signal is inputted through, for example, a left-hand end of the first high-frequency circuit 51 disposed in the first embedded dielectric 52 and then transmitted to an input side terminal of the high frequency circuit element 59 through the layer-connection via hole 63, and the second high frequency circuit 61 disposed in the second embedded dielectric 60. Then, the high frequency signal appearing on an output side terminal of the high frequency circuit element 59 advances again toward the right-hand end of the first high frequency circuit 51. In this operation, required power-supply/control signal and so on are transmitted to the input and output side terminals of the high frequency circuit element 59 from the power-supply/control circuit element 57 through the power-supply/control circuit wiring 58 and the power-supply/control circuit connection via hole 56.

With the conventional high frequency multilayer integrated circuit mentioned above, however, the high frequency circuit and the power-supply/control circuit are disposed to the dielectric layers which are different from each other. This provides a problem of difficulty in reduction of the number of the dielectric layers. In addition, since the circuit element is arranged only on one surface, i.e., upper surface, of the multi-layered dielectric material, it is difficult to integrate it into compact size and also difficult to reduce circuit arrangement area.

Moreover, it is required to work a cavity to the dielectric, which results in increasing of a working cost, and in addition, it is necessary to take countermeasure to heat radiation from the high frequency circuit element disposed in the cavity. Such undesired phenomenon results in deterioration in performance of the high frequency circuit element due to heat generation thereof and decreasing of its usable life time, thus being undesirable.

SUMMARY OF THE INVENTION

The present invention was conceived by taking into consideration the above circumstances encountered in the prior art, and an object of the present invention is to provide a high frequency multilayer integrated circuit having compact structure capable of reducing a number of layers of a laminated circuit board and a circuit area without increasing interference between signals.

The above and other objects can be achieved according to the present invention by providing a high frequency multilayer integrated circuit comprising:

a multilayer board including n earth conductor layers (n: integer of two or more than two) and (n-1) dielectric layers each arranged between adjacent earth conductor layers;

a first high frequency circuit disposed in one of the most outside earth conductor layers of the multilayer board;

a first power-supply/control circuit disposed in the one of the most outside earth conductor layers of the multilayer board;

a second high frequency circuit disposed in at least one of the (n-1) dielectric layers and connected to the first high frequency circuit in the multilayer board;

a second power-supply/control circuit disposed in another one of the most outside earth conductor layers of the multilayer board; and a third power-supply/control circuit disposed in at least one of the (n-1) dielectric layers at a portion other than a portion at which the second high frequency circuit is disposed, the third power-supply/control circuit being connected, in the multilayer board, to the first and second power-supply/control circuits.

In a preferred embodiment of the above aspect, it is desirable that the high frequency multilayer integrated circuit further includes: a first high frequency circuit element disposed on the one of the most outside layer of the earth conductor in which the first high frequency circuit and the first power-supply/control circuit are arranged, the first high frequency circuit element being connected to the first high frequency circuit and the first power-supply/control circuit; and a power-supply/control circuit element disposed on the another one of the most outside layer of the earth conductor in which the second power-supply/control circuit is arranged, the power-supply/control circuit element being connected to the second power-supply/control circuit.

The high frequency multilayer integrated circuit may further include: a conductor plate disposed in the another one of the most outside layer of the earth conductor so as to cover the opening of the through hole formed to the multilayer board and in contact with the earth conductor on this outermost side; and a second high frequency circuit element disposed inside the through hole in contact with the conductor plate and connected to the first high frequency circuit and the first power-supply/control circuit.

The power-supply/control circuit element is provided with a plurality of power-supply/control terminals, which are connected to the power-supply/control circuit, and the high frequency circuit element is provided with a plurality of high frequency terminals, which are connected to the high frequency circuit.

In addition, the first high frequency circuit and the first power-supply/control circuit may be separated from the one of the most outside earth conductor layers, and the second power-supply/control circuit may be separated from the other one of the most outside earth conductor layers.

Further, it is to be noted that the term "power-supply/control" used herein for the present invention generally means "power-supply and/or control".

According to the high frequency multilayer integrated circuit of the present invention of the characters mentioned above, the number of the layers of the laminated multilayer circuit board and the circuit arrangement area thereof can be reduced without increasing the interference between signals, thus providing a compact high frequency multilayer integrated circuit having an improved reliability in performance.

The nature and further characteristic features will be made more clear from the following descriptions made with reference to the accompanying drawings.

BRIEF DESCRIPTION OF THE DRAWINGS

In the accompanying drawings:

FIG. 1 includes FIGS. 1A and 1B showing illustrated plan views of one embodiment of a high frequency multilayer integrated circuit according to the present invention, in which

FIG. 2 includes FIGS. 2A to 2D showing illustrated sectional views of respective portions of the high frequency multilayer integrated circuit of FIG. 1, in which

DESCRIPTION OF THE PREFERRED EMBODIMENT

Figure 1A:
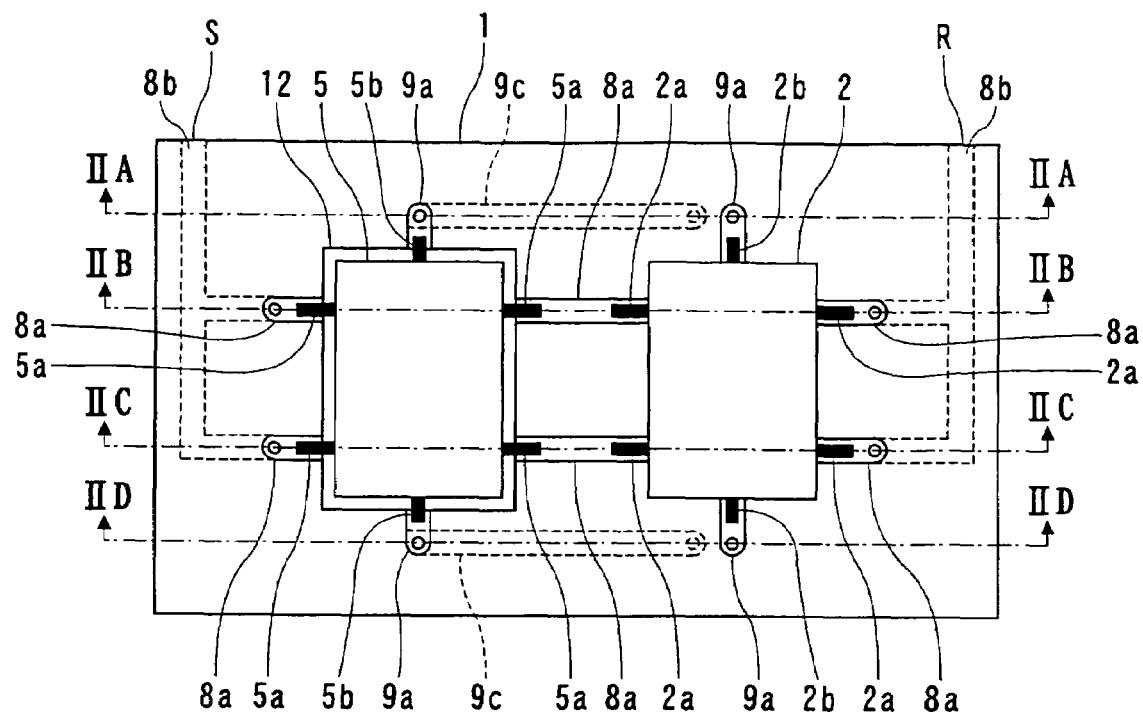
FIG. 1A is a top plan view and FIG. 1B is a bottom plan view.

One preferred embodiment of a high frequency multilayer integrated circuit according to the present invention will be described hereunder with reference to FIGS. 1 and 2. Further, it is to be noted that terms "upper", "lower", "right", "left" and the like are used, for the described embodiment, with reference to the illustrated state or generally usable state of the integrated circuit.

In the illustrated embodiment, a high frequency multilayer integrated circuit (IC) includes a multilayer or multilayered board having three layers as earth conductors and two layers of dielectric disposed alternately between these earth conductors.

Figure 1B:
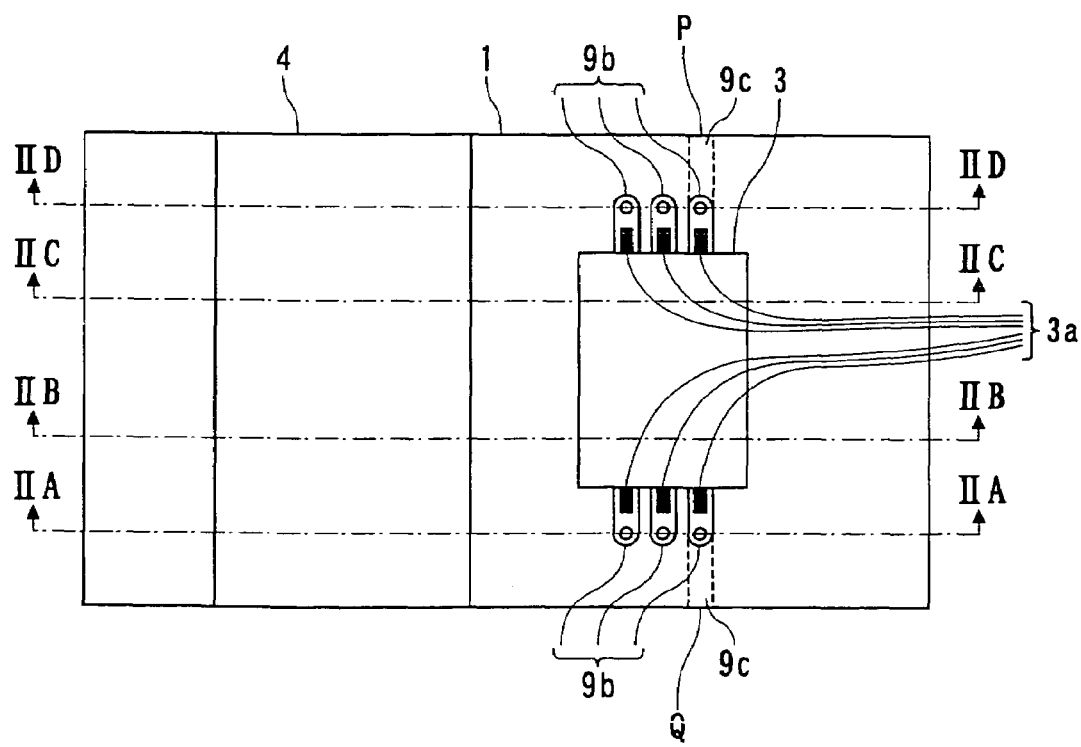
Figure 2A:
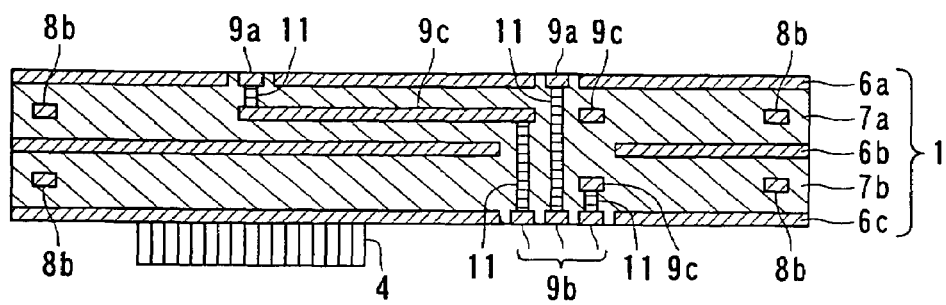
FIGS. 2A, 2B, 2C and 2D are taken along the lines IIA-IIA, IIB-IIB, IIC-IIC and IID-IID, respectively, shown in FIGS. 1A and 1B.
Figure 2B:
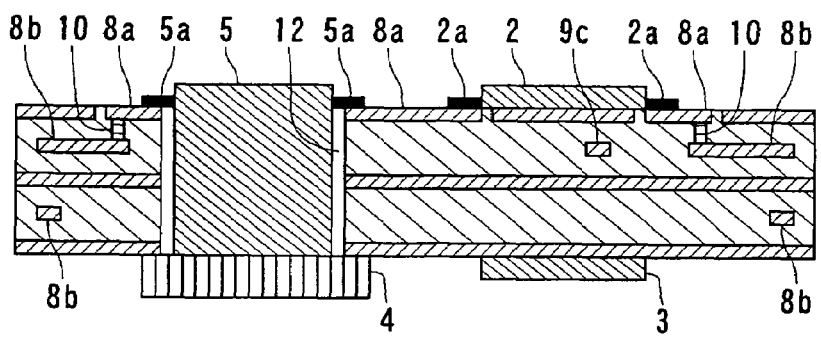
Figure 2C:
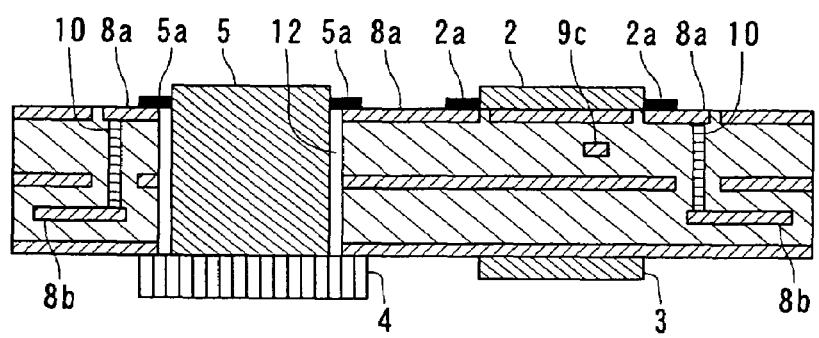
Figure 2D:
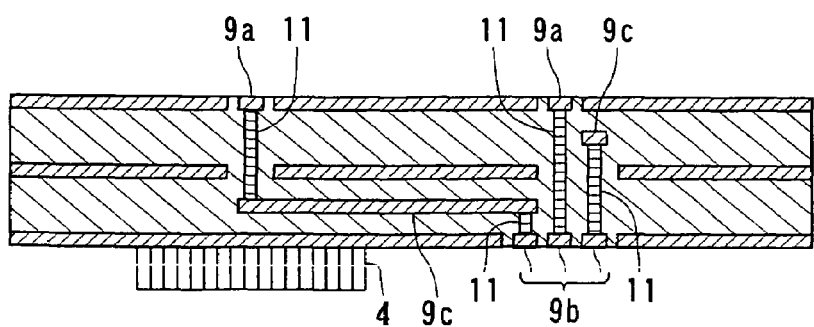
Figure 3:
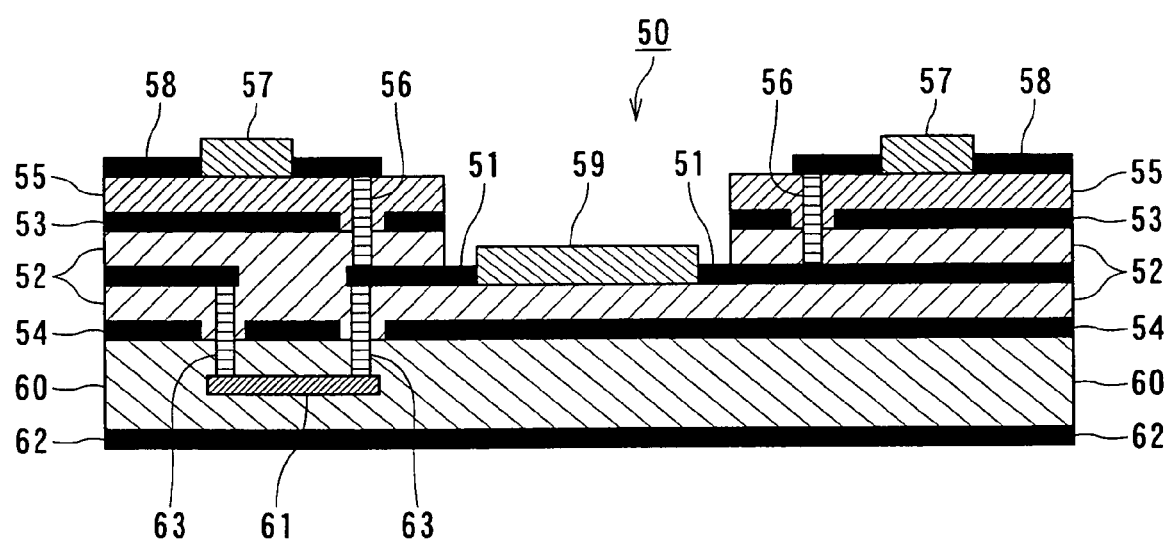
FIG. 3 is an illustrated sectional view of one example of a high frequency multilayer integrated circuit of conventional structure.

The high frequency multilayer integrated circuit, as shown in FIGS. 1 and 2, comprises a multilayer board 1, a first high frequency circuit element 2, a power-supply/control circuit element 3, a conductor plate 4, and a second high frequency circuit element 5.

The multilayer board 1 includes three layers of earth conductors 6a, 6b and 6c and two layers of dielectrics 7a and 7b disposed or laminated alternately between adjacent earth conductors, respectively. This multi-layered structure includes the earth conductor 6a, constituting one of the most outside layer of the multilayer board 1, to which a first high frequency circuit 8a and a first power-supply/control circuit 9a are formed in a manner separated therefrom. A second high frequency circuit 8b is also formed in the dielectrics 7a and 7b. The first and second high frequency circuits 8a and. 8b are connected, inside the multilayer board 1, through a connection conductor 10.

The multilayer board 1 also includes the earth conductor 6c, constituting the other one of the most outside layer, to which a second power-supply/control circuit 9b is formed in a fashion separated from the earth conductor 6c. In addition, a third power-supply/control circuit 8c is formed in an area, inside the dielectrics 7a and 7b, in which the second powers source/control circuit does not exist. In the above arrangement, the first, second and third power-supply/control circuits 9a, 9b and 9c are mutually connected to each other inside the multilayer board 1 via connection conductors 11.

The first high frequency circuit element 2 is mounted to the surface of the earth conductor 6a of the multilayer board 1 in contact with this earth conductor 6a. The first high frequency circuit element 2 is equipped with a plurality of high frequency terminals 2a through which high frequency signals are inputted or outputted and a plurality of power-supply/control terminals 2b through which power-supply/control signals are inputted or outputted. The high frequency terminals 2a are connected to the first high frequency circuit 8a, and the power-supply/control circuit terminals 2b are connected to the first power-supply/control circuit 9a, respectively.

The power-supply/control circuit element 3 is mounted to the surface of the earth conductor 6c of the multilayer board 1 in contact therewith at a position opposite to the first high frequency circuit element 2. This power-supply/control circuit element 3 is provided with a plurality of power-supply/control terminals 3a through which power-supply/control signals are inputted or outputted and which are connected to the second power-supply/control circuit 9b.

The multilayer board 1 is formed with the earth conductors 6a, 6b, 6c, and a through hole 12 penetrating the dielectrics 7a, 7b. The through hole 12 has an end opening on the earth conductor (6c) side. A flat-shaped conductor plate 4 is disposed in contact with the earth conductor 6c so as to cover this opening, and the through hole 12 is fitted with a second high frequency circuit element 5 in contact with the conductor plate 4. The second high frequency circuit element 5 is equipped with a plurality of high frequency terminals 5a through which high frequency signals are inputted or outputted and a plurality of power-supply/control terminals 5b through which power-supply/control signals are inputted or outputted. The high frequency terminals 5a are connected to the first high frequency circuit 8a, and the power-supply/control circuit terminals 2b are connected to the first power-supply/control circuit 9a, respectively.

In the arrangement mentioned above, for example, with reference to FIG. 1A, when a high frequency signal is inputted from a terminal point R of the second high frequency circuit 8b on the right end side of FIG. 1A, this high frequency signal is transferred through the second high frequency circuit 8b, the connection conductor 10 and the first high frequency circuit 8a and is then inputted into the first frequency circuit element 2, in which necessary procedures are carried out. The high frequency signal outputted from the first frequency circuit element 2 is again transferred through the first high frequency circuit 8a in the leftward direction on FIG. 1A and then inputted into the second high frequency circuit element 5, in which necessary procedures are carried out. Thereafter, the high frequency signal outputted from the second high frequency circuit element 5 is transferred again leftward, through the first high frequency circuit 8a, the connection conductor 10 and the second high frequency circuit 8b, to the terminal point S of the high frequency circuit 8b on the left end side in FIG. 1A.

Further, the power-supply/control signals for performing the necessary and predetermined functions for the high frequency signals are generated from the power-supply/control circuit element 3 to the first and second high frequency circuit elements 2 and 5 through the second power-supply/control circuit 9b, the connection conductor 11, the third power-supply/control circuit 9c and the first power-supply/control circuit 9a. Furthermore, the transmittance of the power-supply/control signal between the power-supply/control circuit element 3 is carried out via terminal points P and Q of the end portions of the third power-supply/control circuit 9c.

As mentioned hereinbefore, according to the high frequency multilayer integrated circuit of the embodiment of the present invention, without disposing a dielectric layer in conformity with a kind of a signal to be processed, the high frequency circuit processing the high frequency signal and the power-supply/control circuit processing the power-supply/control signal are arranged in the same dielectric layer. In addition, these circuits are arranged at portions different from each other in the dielectric layer to thereby reduce an influence between the signals therefrom. Accordingly, even in the case that many kinds of signals having different functions are processed, the number of layers of the dielectrics can be reduced without increasing the influence or interference between the signals.

In addition, in the present embodiment, the high frequency circuit element is disposed on one of the most outside earth conductors and the power-supply/control circuit element is also disposed on the other one of the most outside earth conductors opposing, in position, to the above-mentioned high frequency circuit element, and the power-supply/control circuit is arranged concentrically in the dielectric layer at the position sandwiched between these two elements. According to such arrangement, there can be provided a compact high frequency multilayer integrated circuit.

Furthermore, in the embodiment, the through hole is formed to the multilayer board, the conductor plate is disposed so as to cover one of the opening of this through hole, and the high frequency circuit element is arranged inside the through hole to be contacted with the conductor plate. In such embodiment, if the high frequency circuit element is composed of a high heat-generation element such as element having amplifying function, heat generated from the high frequency circuit element can be effectively transferred to the conductor plate, thus providing an improved hear radiation effect and, hence, preventing the high frequency circuit element from being deteriorated in its specific functions and improving its life time and improving the reliability in performances. Moreover, it is not necessary to carry out any cavity working to the opening of the through hole, thereby improving the mechanical reliability with cost reduction.

It is to be noted that the present invention is not limited to the described embodiment and many other changes and modifications may be made without departing from the scopes of the appended claims.

For example, in the described embodiment, although there are alternately disposed three earth conductor layers and two dielectric layers, the numbers of such layers are not limited as those described. Furthermore, the flat conductor plate 4 may be substituted with a conductor plate having partially protruded portion which has a size capable of being fitted to the opening of the though hole formed to the multilayer board.

What is claimed is:

1. A high frequency multilayer integrated circuit comprising:
   a multilayer board including n earth conductor layers (n: integer of two or more than two) and (n-1) dielectric layers each arranged between adjacent earth conductor layers;
   a first high frequency circuit disposed in one of the most outside earth conductor layers of the multilayer board;
   a first power-supply/control circuit disposed in the one of the most outside earth conductor layers of the multilayer board;
   a second high frequency circuit disposed in at least one of the (n-1) dielectric layers and connected to the first high frequency circuit in the multilayer board;
   a second power-supply/control circuit disposed in another one of the most outside earth conductor layers of the multilayer board; and
   a third power-supply/control circuit disposed in at least one of the (n-1) dielectric layers at a portion other than a portion at which the second high frequency circuit is disposed, said third power-supply/control circuit being connected, in the multilayer board, to the first and second power-supply/control circuits.

2. The high frequency multilayer integrated circuit according to claim 1, further comprising: a first high frequency circuit element disposed on the one of the most outside layer of the earth conductor in which the first high frequency circuit and the first power-supply/control circuit are arranged, the first high frequency circuit element being connected to the first high frequency circuit and the first power-supply/control circuit; and a power-supply/control circuit element disposed on the another one of the most outside layer of the earth conductor in which the second power-supply/control circuit is arranged, said power-supply/control circuit element being connected to the second power-supply/control circuit.

3. The high frequency multilayer integrated circuit according to claim 1, wherein said first high frequency circuit and said first power-supply/control circuit are separated from the one of the most outside earth conductor layers, and said second power-supply/control circuit is separated from the another one of the most outside earth conductor layers.

4. The high frequency multilayer integrated circuit according to claim 2, wherein the multilayer board is formed with a through hole having one end opening, and further comprising: a conductor plate disposed in the another one of the most outside layer of the earth conductor so as to cover the opening of the through hole and in contact with the earth conductor on this outermost side; and a second high frequency circuit element disposed inside the through hole in contact with the conductor plate and connected to the first high frequency circuit and the first power-supply/control circuit.

5. The high frequency multilayer integrated circuit according to claim 2, wherein the power-supply/control circuit element is provided with a plurality of power-supply/control terminals, which are connected to the power-supply/control circuit, and the high frequency circuit element is provided with a plurality of high frequency terminals, which are connected to the high frequency circuit.

* * * * *